United States Patent [19]

Baker

[11] Patent Number: 5,155,362

[45] Date of Patent: Oct. 13, 1992

[54] INFRA-RED RADIATION IMAGING DEVICE ARRANGEMENTS

[75] Inventor: Ian M. Baker, Romsey, United Kingdom

[73] Assignee: Philips Electronics UK Limited, London, England

[21] Appl. No.: 510,179

[22] Filed: Jun. 24, 1983

[30] Foreign Application Priority Data

Jul. 28, 1982 [GB] United Kingdom ............... 8221786

[51] Int. Cl.⁵ .................. H01L 25/00; H01L 29/78; H01L 27/14
[52] U.S. Cl. .................................. 250/332; 357/30; 357/23.2
[58] Field of Search ............... 250/332, 214 B, 214 C, 250/211 J; 357/30, 24 LR

[56] References Cited

U.S. PATENT DOCUMENTS

| 4,001,501 | 1/1977 | Weimer | 357/30 |
| 4,040,076 | 8/1977 | Kosonocky et al. | 357/30 |
| 4,375,597 | 3/1983 | Kosonocky | 357/30 |
| 4,467,340 | 8/1984 | Rode et al. | 357/30 |

Primary Examiner—Stephen C. Buczinski
Assistant Examiner—Linda J. Wallace
Attorney, Agent, or Firm—Cushman, Darby & Cushman

[57] ABSTRACT

An imaging device arrangement comprises infra-red radiation detector elements (10) and signal-processing circuitry including at least one charge-transfer line (30). The detector elements (10) are preferably cadmium mercury telluride photodiodes formed in a common body or body portion which is secured to a substrate (e.g. of silicon) comprising the charge-transfer line (30). Each detector element (10) is connected between an input connection (2,3) of the charge-transfer line (30) and a common electrical connection (4). At least one storage electrode (62) and at least one subtraction gate (63) are present at each input connection (2,3) for subtracting at least one portion (77) of the charge-signal so that only a portion (78) of the charge-signal from each detector element (10) is transferred along the charge-transfer line (30). The substracted charge (77) is drained away via the radiation detector elements (10) by means of a pulse generator (50) or other voltage switching means which is connected to the common electrical connection (4) to switch the common voltage applied to the detector elements (10). A compact structure with fast draining at each input connection (2,3) is obtained. The pulse generator (50) can be formed with other pulse generators of the at least one charge-transfer line (30) in a peripheral area of the circuit substrate.

11 Claims, 4 Drawing Sheets

INFRA-RED RADIATION IMAGING DEVICE ARRANGEMENTS

This invention relates to infra-red radiation imaging device arrangements comprising a plurality of infra-red radiation detector elements (for example, of cadmium mercury telluride), and signal processing circuitry (for example, in a silicon circuit substrate) for providing an output signal representative of the radiation image incident on the detector elements.

The paper entitled "Source-Coupled HgCdTe Staring Hybrid Focal Planes for Tactical Applications" by K. Chow, J. D. Blackwell, J. P. Rode, D. H. Seib and W. N. Lin in Volume 267, pages 12 to 17 of the Proceedings of the SPIE (Society of Photo-optical Instrumentation Engineers) Technical Symposium (1981), Los Angeles, describes an infra-red radiation imaging device arrangement comprising a plurality of infra-red radiation detector elements in which charge-signals are generated by incident infra-red radiation, and signal-processing circuitry for processing the charge-signals from the detector elements to provide an output signal representative of the radiation image incident on the detector elements. This circuitry includes at least one charge-transfer line to which the radiation detector elements are coupled via input connections. Each radiation detector element is electrically connected between the input connection of the charge-transfer line and a second electrical connection of said plurality of detector elements. At least one storage electrode and a subtraction gate are present at each of the input connections for subtracting at least one portion of the charge-signal so that only a portion of the charge-signal is transferred along the charge-transfer line, and means are provided for draining away the subtracted charge from a storage well below the storage electrode.

This known device arrangement has an array of 32×32 photovoltaic detector elements formed in a layer of cadmium mercury telluride on a cadmium telluride substrate which is transparent to the infra-red radiation. The signal-processing substrate is of silicon, and has 32 parallel CCD lines corresponding to the 32 rows of the detector element array. The input connections from the detector elements are present along these parallel CCD lines which provide parallel inputs of the charge-signals derived from the 32 detector element rows into a further charge-coupled device which provides a serial output of each column in succession. The centre-to-centre pitch of the input connections (and also of the detector elements) is 68 micrometers. The second electrical connection of the detector elements is earthed.

As is well-known, the charge representing useful information in the incident radiation image can be obscured by the accumulation of a high level of undesirable charge representing dark current leakage in the detector elements as well as high ambient radiation incident on the detector elements. The former results in charge being collected even in the absence of the incident radiation, while the latter occurs, especially in the 8 to 14 micrometer radiation waveband, when the ambient in a scene viewed by the imaging device contributes a high level of radiation so that the scene contrast is low and the amount of the signal which is of interest is only a very small part of the total radiation reaching the array. Both types of undesirable charge may be referred to as background charge. Subtraction processing of the charge-signals in this device arrangement is used to improve the effective dynamic range of the CCD.

Two forms of charge-subtraction are described, namely charge-partitioning and charge-skimming. For this purpose there are two subtraction gates, the first of which is a partition gate (designated by reference P in FIG. 3 of the Chow et al paper) and the second of which is a threshold gate (designated by reference MET in FIG. 3 of the Chow et al paper). In the mode of operation described for this known imaging device arrangement the charge-signal from a detector element is collected during the integration period in a wide storage well below the storage electrode S and the partition gate P. The partition gate P is then clocked to divide the collected charge into two packets, only the second of which is to be further processed using the threshold gate. The first charge packet which is a major fraction of the originally collected charge is subsequently drained. By lowering the threshold gate to the appropriate threshold level a portion of the second charge-packet is "skimmed" into an integration well associated with one of the clocking electrodes of the parallel CCD lines; it is this portion of the charge-signal which is subsequently transferred along the CCD lines. The charge-skimming is sometimes also called "background-subtraction", since it results in a given background charge level (determined by the voltage of the threshold gate) being subtracted from the charge-signal. Subsequently, the partition gate P is opened to merge the first packet and the subtracted portion of the second packet which are then drained away together to the drain of a MOSFET via its drain gate.

The provision of so many input circuit elements (storage electrodes, input and subtraction gates and drain MOSFET) between the parallel CCD lines restricts the minimum centre-to-centre pitch which can be used for the input connections and the detector elements, and restricts the maximum area (and hence the charge-storage capacity) of the clocking electrodes of the CCD lines. With such focal-plane imaging arrays it is also desirable usually to collect and to integrate the charge from the detector elements for as long a time as is compatible with the read-out time for the CCD lines. This necessitates a large charge capacity for the storage wells below the storage electrodes. However it is usually undesirable to increase this charge capacity by increasing the extent of the storage electrodes since this increases the pitch of the detector elements and their input connections. A smaller centre-to-centre pitch is often desirable, for example a pitch of at most 50 micrometers.

According to the present invention there is provided an infra-red radiation imaging device arrangement comprising a plurality of infra-red radiation detector elements in which charge-signals are generated by incident infra-red radiation, and signal-processing circuitry for processing the charge-signals from the detector elements to provide an output signal representative of the radiation image incident on the detector elements, said circuitry including at least one charge-transfer line to which the radiation detector elements are coupled via input connections, each radiation detector element being electrically connected between the input connection of the charge-transfer line and a second electrical connection of said plurality of detector elements, at least one storage electrode and at least one subtraction gate being present at each of the input connections for subtracting at least one portion of the charge-signal so that only a portion of the charge-signal from each detector element is transferred along the charge-transfer line, and means for draining away the subtracted charge from a storage well below the storage electrode, characterized in that the subtracted charge is drained away via the radiation detector elements by means of a voltage switching means which is connected to the second electrical connection to switch the voltage applied to the radiation detector elements.

Thus, the potential of the second electrical connection of these detector elements can be held at one level while integrating the charge signal from the detector elements and can be subsequently switched to a different level by means of the voltage switching means to drain away the subtracted charge at each input location. Such an infra-red radiation imaging device arrangement in accordance with the present invention permits the subtracted charge to be drained away in a short time and in a manner which is comparatively simple and which does not require any drain MOSFET or other additional circuit component at the location of the input connections. This is particularly advantageous for a 2-dimensional array in minimising the pitch of parallel charge-transfer lines each of which has radiation detector elements coupled via input connections at locations spaced along the lines. A particularly compact structure can be obtained when the infra-red detector elements are photodiodes formed in a common body or body portion of infra-red sensitive material, the bulk of which is a common region connected to the second electrical connection, since the common bulk region effectively provides the charge-transfer line(s) with an additional electrical connection level without complicating the electrode structure of the charge-transfer line(s). Especially when a complete array of such radiation detector elements are formed in a common body or body portion, all the detector elements of the array can be provided in a simple manner with one common electrical connection to which the voltage switching means is connected. However it is also possible (but more complicated for the connection layout) to group the detector elements of an array into particular groups or pluralities each having its own second connection so that for example each row of detector elements in a 2-dimensional array may have its own separate common connection and its own separate voltage switching means.

The voltage switching means may be a voltage pulse generator and may be provided together with the at least one charge-transfer line in a common signal-processing circuit substrate to which the radiation detector elements are secured. Thus, pulse generators for the charge-transfer line or lines and for draining the subtracted charge via the radiation detector elements may be fabricated together in peripheral areas of a common substrate which comprises the charge-transfer line(s). However it is also possible to provide the voltage switching means as a separate discrete device outside a vacuum envelope (for example a dewar encapsulation) containing the infra-red detector element arrangement.

The charge-subtraction in an imaging device arrangement in accordance with the present invention may involve charge-skimming and/or charge partitioning. Thus, in the case of charge-partitioning, the subtraction gate (or at least one of the subtraction gates) present at each of said locations comprises a partition gate for subtracting a given fraction of the charge-signal at that location. For charge-skimming purposes however, the subtraction gate (or at least one of the subtraction gates) present at each of said locations comprises a threshold gate for subtracting a given background level from the charge signal at that location. In this latter case a particular compact structure can be obtained with the threshold gate being formed by at least a portion of a clocking electrode of the charge-transfer line. Furthermore the background storage electrode at each location can be formed by one or more clocking electrodes of the charge-transfer line so as to have a high charge capacity for the background storage well in a compact geometry. This is particularly advantageous for minimising the pitch of parallel charge-transfer lines, each of which has radiation detector elements connected via input connections at locations spaced along the lines; such an arrangement is described in our simultaneously-filed patent application (Our reference: PHB 32900) which is also entitled "Infra-red Radiation Imaging Device Arrangements".

In order to obtain a large charge capacity for the background storage well it is preferable for the background storage electrode for each input connection to be formed by at least a part of two clocking electrodes. In this case it may be necessary to form the remaining-signal storage well either below a signal storage electrode which is located at one side of at least part of one clocking electrode or below a separately clockable part of one clocking electrode. Thus one of the clocking electrodes may be divided into three separately clockable parts of which the first forms part of the background storage electrode, the second provides the threshold gate, and the third provides a signal storage electrode below which the remaining-signal storage well can be formed. However it is also possible to form the background storage well below one clocking electrode, the remaining-signal storage well below another clocking electrode and to use an intermediate clocking electrode of the charge-transfer line to provide the threshold gate.

A particularly compact geometry can be obtained when at each of the input-connection locations one of the clocking electrodes has a recess at one side, and the input connection and an input gate are located in said recess.

Embodiments of the present invention will now be described, by way of example, with reference to the accompanying diagrammatic drawings, in which.

Figure 1:
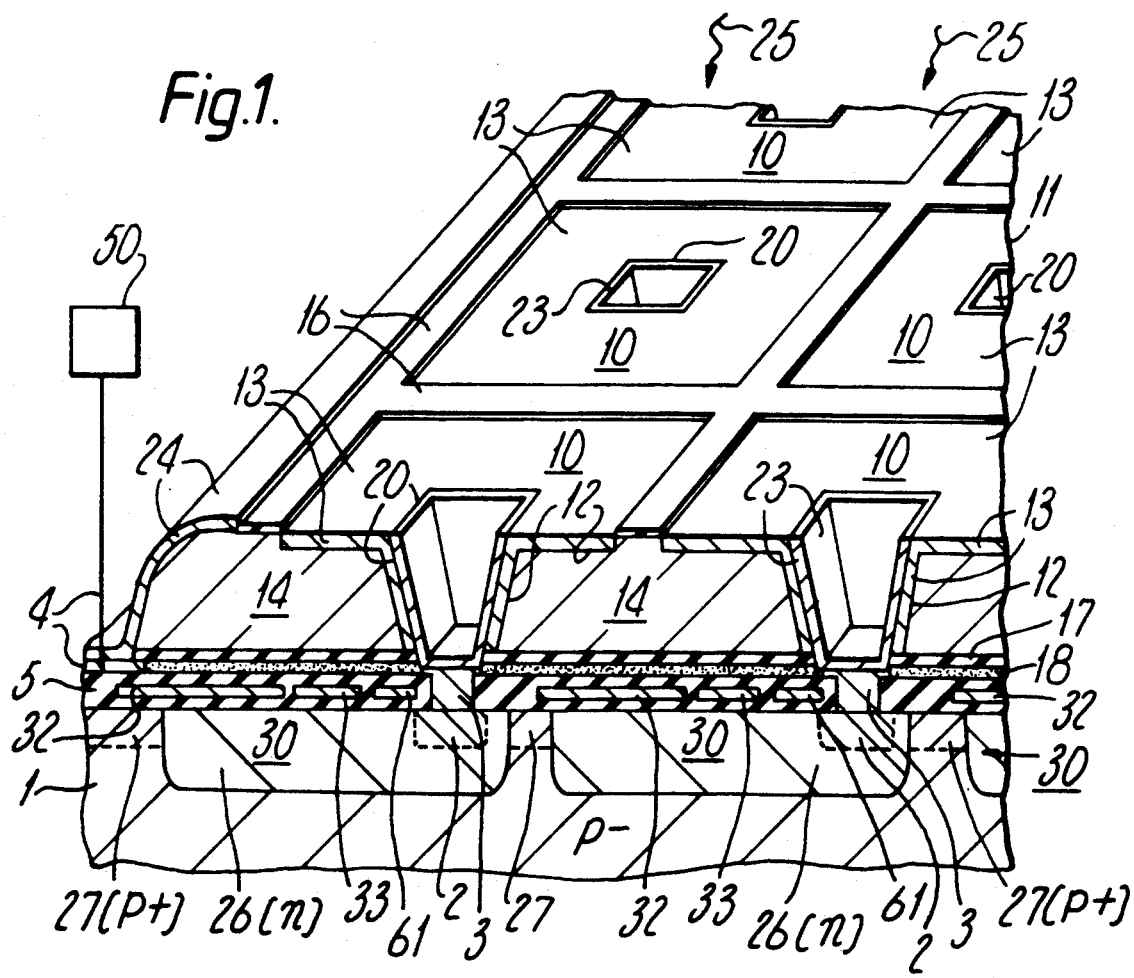
FIG. 1 is a partial cross-sectional view and partial perspective view of part of an infra-red radiation imaging device of an arrangement in accordance with the invention.

It should be noted that all the Figures are only diagrammatic and not drawn to scale, and that dimensions of some parts have been strongly exaggerated both for clarity and convenience in the drawing. The same reference designations as used in one embodiment are generally used to refer to corresponding or similar parts in the other embodiments.

Figure 2:
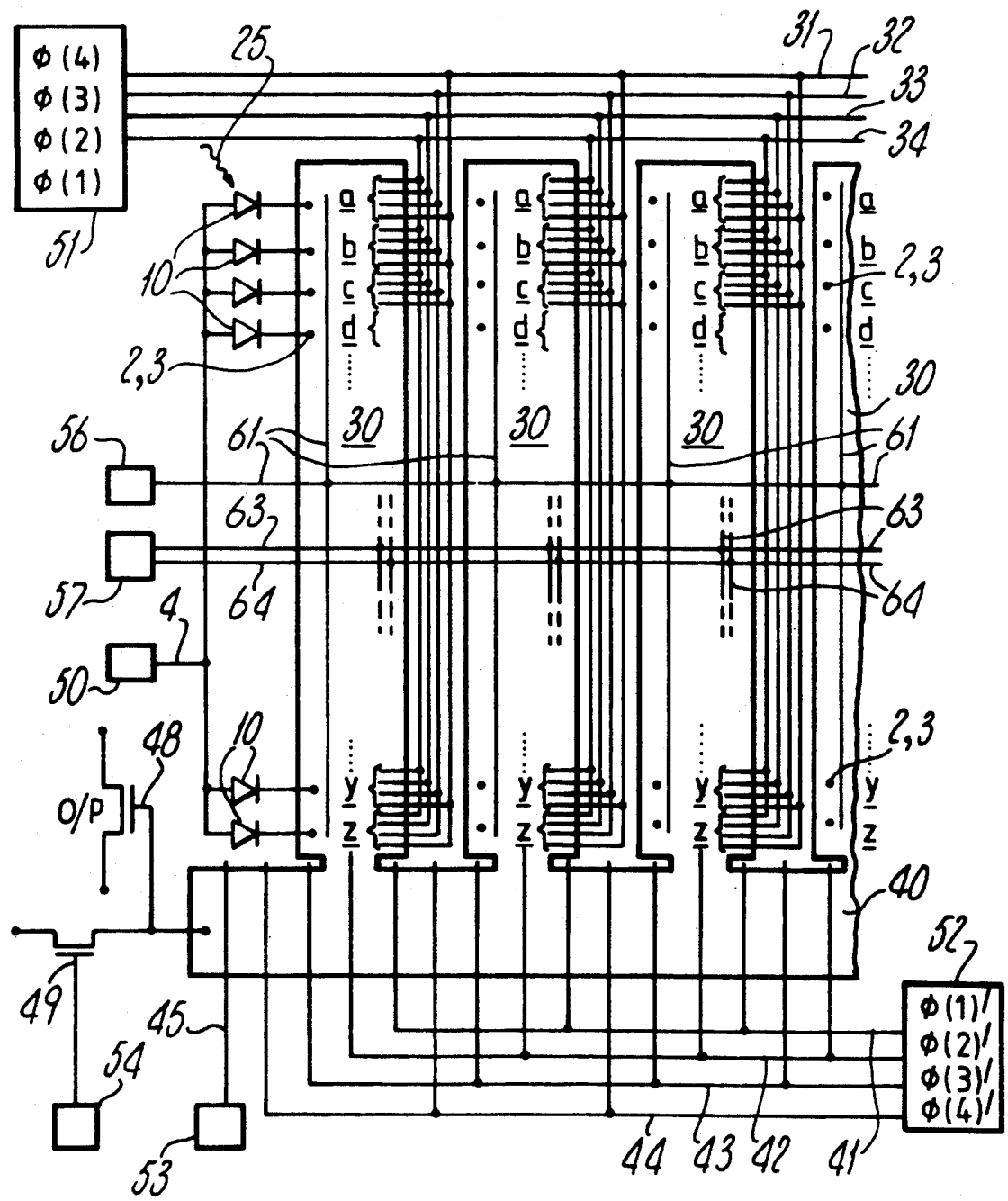
FIG. 2 is a schematic representation of such a device arrangement in accordance with the invention.

The infra-red radiation imaging device arrangement of FIGS. 1 and 2 comprises an array of infra-red radiation detector elements 10 in which charge-signals are generated by incident infra-red radiation 25, and a substrate 1 comprising signal-processing circuitry which provides an output signal representative of the radiation image 25 incident on the array. This substrate circuitry includes parallel charge-transfer lines 30 each of which comprises a row of clocking electrodes 31 to 34 which are arranged in groups a to z (in FIG. 2) as a charge-coupled device (for example groups of four electrodes for a four-phase charge-coupled device) to permit charge-transfer along the line by the application of clock voltages (for example $\phi(1)$, $\phi(2)$, $\phi(3)$ and $\phi(4)$ for a four-phase CCD) to these clocking electrodes. The cross-section of FIG. 1 is taken across the width of two complete lines 30 and part of one line 30, which lines extend parallel to each other in the perspective direction of the drawing of FIG. 1. In this cross-section across the lines 30, only two of the clocking electrodes are shown, namely electrodes 32 and 33. In the case of the arrangement of FIG. 5, only the clocking electrode 32 would be seen in FIG. 1.

The radiation detector elements 10 are secured to the circuit substrate 1 at the area which includes these parallel charge-transfer lines 30. At locations which are associated with individual groups a to z of these clocking electrodes 31 to 34 and which are spaced along the length of the charge-transfer lines 30 (i.e. in the perspective direction of the drawing of FIG. 1) there is an array of input connections 2,3 which corresponds to the array of detector elements 10. Via these input connections 2,3 the detector elements 10 are connected to the charge-transfer lines 30. The cross-section of FIG. 1 is taken through two such input connections 2,3 which as illustrated in the drawing comprise a metal electrode 3 contacting a highly doped (N+) semiconductor contact region 2.

Apart from its signal-processing circuitry which as will be described later is constructed and organized to provide a device arrangement in accordance with the present invention, the particular device structure illustrated in FIG. 1 is similar to that described in our published U.K. Patent Application GB-A 2095905 (Our reference: PHB 32767). Thus, the detector elements 10 are photodiodes formed in a common body 11 of infrared sensitive material, for example cadmium mercury telluride. The bulk 14 of the body 11 is of one conductivity type, and each detector element 10 comprises a region 13 of opposite conductivity type which forms with the bulk 14 a p-n junction 12 for detecting charge-carriers generated in the infra-red sensitive material by the infra-red radiation 25. The material composition may be chosen to respond to radiation 25 in, for example, the 8 to 14 micrometer waveband or the 3 to 5 micrometer waveband. These infra-red detector diodes 10 have electrode metallization 23 and 24 which respectively contact the regions 13 and the bulk 14. Passivating insulating layers 16 and 17 are present on the opposite major surfaces of the detector element body 11.

The detector element body 11 is secured to the circuit substrate 1 which is typically monocrystalline silicon by a layer of electrically insulating adhesive 18. An array of apertures 20 extends through the thickness of the body 11 and also through the adhesive layer to reach the input-connection electrodes 3 exposed at the upper major surface of the substrate 1. Each of the apertures 20 is associated with a detector diode 10, and the centre-to-centre spacing of these apertures 20 in the device of FIG. 1 may be, for example, 50 micrometers. The detector-diode regions 13 extend through the thickness of the body 11 at the side-walls of the apertures 20 and are electrically connected to the input-connection electrodes 3 of the parallel CCD lines 30 of the substrate 1 by the metallization 23 which is located in these apertures 20. The metallization 24 may contact the bulk 14 around all of the outer side-walls of the body 11 and extend over these side-walls to contact a metallization track 4 exposed at the upper major surface of the substrate 1. The track 4 provides a common connection for all the detector diodes 10 of the array and is connected to a voltage pulse generator 50 which is formed in the substrate 1 and the function of which will be described subsequently. For further details of the construction and the manufacturing process which may be employed for the device of FIG. 1 reference is invited to said published U.K. Patent Application GB-A 2095905.

As illustrated in FIG. 2, the signal-processing circuitry in the substrate 1 comprises a parallel-to-serial charge-coupled device format in which the parallel CCD lines 30 correspond to rows of the detector-element array and provide parallel inputs of the charge-signals from these rows into a further charge-coupled device 40 which provides a serial output O/P of each column in succession. In the case of an array of 32×32 detector diodes 10 there are 32 parallel CCD lines 30 and 32 groups a to z of the clocking electrodes 31 to 34 along each CCD line 30. Similarly there are 32 input connections 2,3 from the detector diodes 10, spaced along each line 30. For convenience and clarity, FIG. 2 shows only some of the detector diodes 10, groups a to z, and input connections 2,3, and it also does not show the full extent of the clocking electrodes 31 to 34 across the full width of the CCD lines 30.

Charge is clocked along the charge-transfer lines 30 by four-phase CCD action with clock voltages $\phi(1)$, $\phi(2)$, $\phi(3)$ and $\phi(4)$ applied to the clocking electrodes 31 to 34 from a pulse generator 51. The charge transferred along the lines 30 is introduced into a potential well below one clocking electrode 42 of the serial output CCD line 40. This CCD line 40 may also be of the four-phase type, and the charge is clocked along it by clocking voltages $\phi'(1)$, $\phi'(2)$, $\phi'(3)$ and $\phi'(4)$ applied to its clocking electrodes 41 to 44 from a pulse generator 52. The output signal can be detected in known manner using an output insulated-gate field-effect transistor 48 separated from the final clocking electrode 44 by an output gate 45 connected to a pulse generator 53. After reading the output signal with the transistor 48 the output potential is reset in known manner via a further insulated-gate field-effect transistor 49 connected to a pulse generator 54. Charge may be transferred directly from below the last clocking electrode 34 of each line 30 to below the input clocking electrodes 42 of the line 40, or this charge transfer may be controlled in known manner by clocking via an intermediate buffer with an input gate and an output gate. All the pulse generators 50 to 54 and the transistors 48 and 49 can be formed in the substrate 1 using known technology, the pulse generators being located in peripheral areas of the substrate 1 outside the area accommodating the charge-transfer lines 30 and 40.

The charge-transfer lines 30 and 40 may be constructed as a surface-channel CCD. However preferably the lines 30 and 40 are formed as a buried channel or so-called "bulk channel" CCD for greater charge transfer efficiency, speed and charge handling capacity. FIG. 1 illustrates such a buried channel device in which the charge-transfer line comprises a fully-depleted n-type channel region 26 in which the potential wells are formed below the clocking electrodes 31 to 34. The n-type channel region 26 is provided in a low-doped p-type silicon substrate. The configuration of the n-type channel region 26 in the substrate 1 corresponds to the parallel-to-series format of the lines 30 and 40. A more highly-doped p-type isolation region extends around the periphery of this n-type region 26 in the p-type substrate. The clocking electrodes 31 to 34 and 41 to 44 as well as other electrodes providing gates and storage electrodes are typically formed of doped polycrystalline-silicon and are insulated from the silicon substrate surface by an insulating dielectric layer, typically of silicon dioxide. These electrodes are separated from each other and for the most part are also covered with electrically insulating material such as silicon dioxide. The electrically insulating material on the silicon substrate surface is designated by reference 5 in FIG. 1. In general it is desirable to slightly overlap adjacent clocking electrodes of the charge-coupled device lines, and this can be achieved in a conventional manner by forming alternate adjacent electrodes (for example the electrodes 31,33 and 42,44) in a second deposition step after forming an insulating layer on the previously-deposited other clocking electrodes (for example the electrodes 32,34 and 41,43). However, such an overlap is not illustrated in the drawings for the sake of clarity in the drawing.

Figure 4:
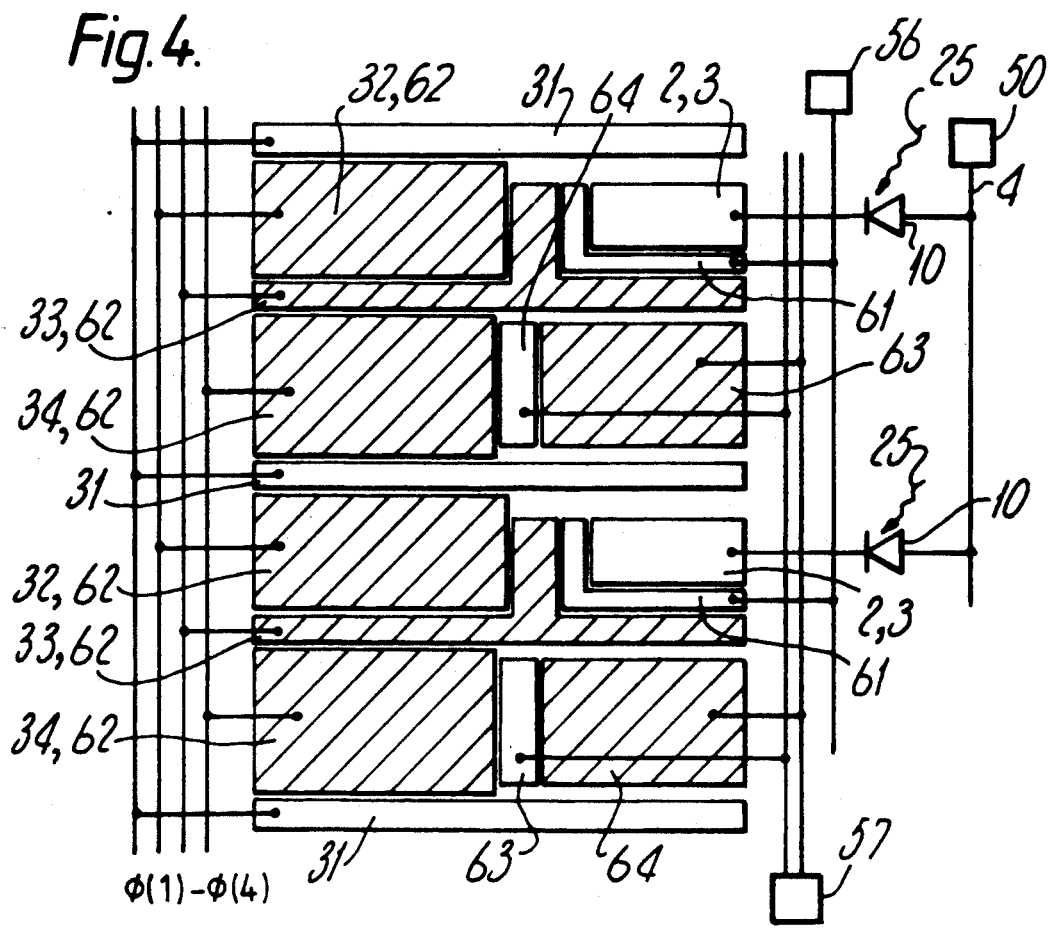
FIG. 4 is a plan view of part of one of the parallel CCD lines of such a device arrangement in accordance with the invention, having a side-located remaining-signal storage well, and additionally illustrates the signal-charge integration and background subtraction stage in its operation.
Figure 5:
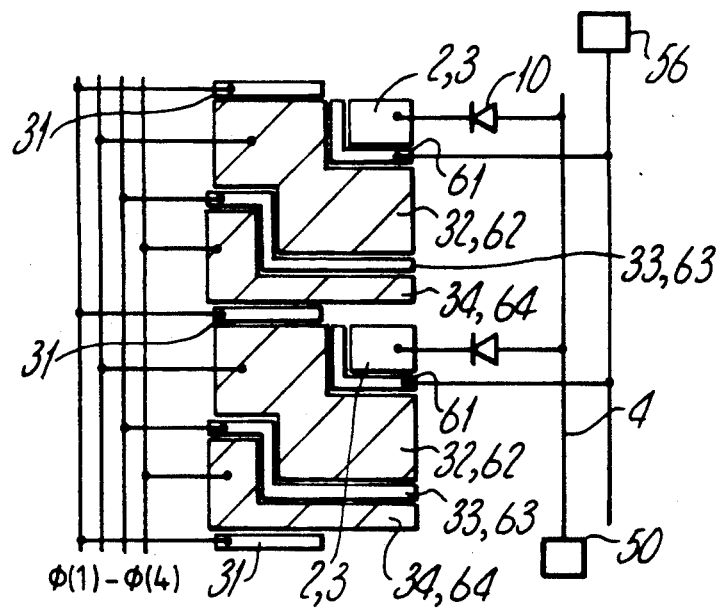
FIG. 5 is a plan view of part of one of the parallel CCD lines of another device arrangement in accordance with the invention, and additionally illustrates the signal-charge integration and background subtraction stage of its operation.

In the device arrangement of FIGS. 1 and 2, not all the charge-signal developed at the input connections 2,3 by the detector diodes 10 is transferred along the parallel CCD lines 30. Thus, the charge-signal from the detector diodes 10 contains a high level of background charge as a result of both dark current leakage in the detector diodes and low thermal contrast in the scene being viewed. At least a significant portion of this background charge is subtracted at each input connection and drained away via the radiation detector elements 10 in accordance with the present invention. Two specific examples of particular arrangements of an input gate 61, a background-storage electrode 62, a threshold subtraction gate 63, and a remaining-signal storage electrode 64 for implementing such background-subtraction are illustrated in FIG. 4 and FIG. 5. However, the general principles and operating sequence for such background-subtraction and draining will first be described with reference to FIGS. 3a to 3e. For the sake of clarity in the drawing the arrangement of the threshold gate 63 and remaining-signal storage electrode 64 at each input-connection location associated with the individual electrode groups a to z is not illustrated in FIG. 2. Furthermore as will be described subsequently with reference to FIG. 5, there does not need to be any separate gate 63, electrode 64 and pulse generator 57.

Figure 3A:
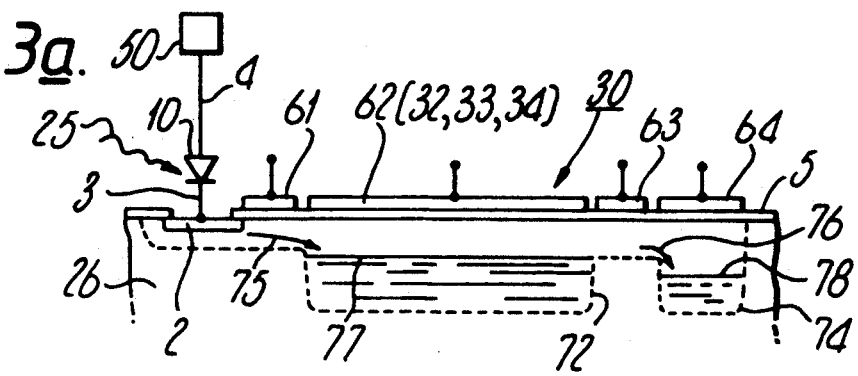
FIG. 3a is a simplified schematic cross-section through one input of one of the parallel CCD lines of the device arrangement of FIG. 2, additionally showing the potential well profile during charge integration and background subtraction.

FIG. 3a is a simplified schematic cross-section through an input of one of the parallel CCD lines 30, showing an input connection 2,3 at one location along the line 30, and also showing a background-storage electrode 62, an input gate 61 between the input connection 2,3 and the background-storage electrode 62, and a threshold gate 63 between the background-storage electrode 62 and a signal storage electrode 64. The arrow 75 illustrates the collection and integration of the charge-signal from the detector diode 10 at that location. During this stage the detector diode 10 is maintained in an overall zero bias condition by the voltages applied to the common connection 4 and the input gate 61; in a typical example of the n-channel buried CCD arrangement of FIG. 1, the detector-diode connection 4 may be maintained at about +5 volts by the quiescent voltage level of the pulse generator 50, and a higher voltage level (for example about +8 volts) is applied to the input gate 61 from the generator 56 to allow for the threshold voltage of the gate 61. The radiation-generated photocurrent then flows via the input connection 2,3 into the storage wells as indicated by arrow 75.

The background-storage electrode 62 and threshold gate 63 serve for subtracting a given background level from the charge-signal at that input-connection 2,3 so as to transfer only that portion of the charge-signal remaining after said subtraction. Such subtraction is also known as charge-signal skimming. The substracted background charge is held in a potential well 72 below the background-storage electrode 62 during the skimming, whereas the remaining signal charge which is "skimmed" from the background is collected in a potential well 74 below the remaining-signal storage electrode 64. In FIG. 3a the arrow 76 illustrates the charge skimming. The charge levels in the background storage well 72 and the remaining-signal storage well 74 are represented by lines 77 and 78 respectively.

In accordance with the invention described and claimed in said simultaneously-filed patent application, the background-storage electrode 62 at each input-connection location along the parallel CCD lines 30 is formed by at least part of at least one of the clocking electrodes 32,33,34 of the associated charge-transfer line 30, as indicated in FIG. 3a. The depth of the background storage well 72 below the at least one clocking electrode 32,33,34 is controlled by the clock voltage $\phi(2)$, $\phi(3)$, $\phi(4)$ applied to that electrode by the pulse generator 51 so that when two or more clocking electrodes 32,33,34 are used as the background-storage electrode their voltages $\phi(2)$, $\phi(3)$, $\phi(4)$ are clocked together during the background storage and skimming stage to form a common potential well 72 below these two or more electrodes 32,33,34. The background storage well 72 below the at least one clocking electrode 32, 33, 34 is coupled to the input connection 2, 3 by the input gate 61 and to the remaining-signal storage well 74 by the threshold gate 63. Although not illustrated in FIG. 3a, the threshold gate 63 and remaining-signal storage electrode 64 may also be formed by at least a separately-clockable part of at least one clocking electrode (32, 33, 34) of the CCD-line 30 as is described in said simultaneously-filed patent application.

During the charge-signal integration and skimming stage illustrated in FIG. 3a, the potential applied to the input gate 61 by a pulse generator 56 (see FIG. 2) permits charge carriers injected from the radiation detector diode 10 to flow to the background storage well 72 as indicated by the arrow 75. The amount of charge held in this well 72 (and hence the background level 77 which is subtracted from the charge-signal) is determined by the clock voltage $\phi(2)$, $\phi(3)$, $\phi(4)$ applied to the clocking electrode(s) 32, 33, 34 forming the background storage electrode 62 and by the potential barrier which is formed between the wells 72 and 74 by the voltage applied to the threshold gate 63 from a pulse generator (57 in FIG. 2). A voltage pulse is also applied to the electrode 64 to control the depth of the storage well 74 for the skimmed charge-signal 78. Adjacent background-storage wells 72 along the CCD lines 30 are isolated from each other by potential barriers which are formed below at least one clocking electrode (31, in the example given) of each group by means of the voltage level $\phi(1)$ applied to that electrode 31 by the pulse generator 51 during this stage in the operating sequence.

Figure 3B:
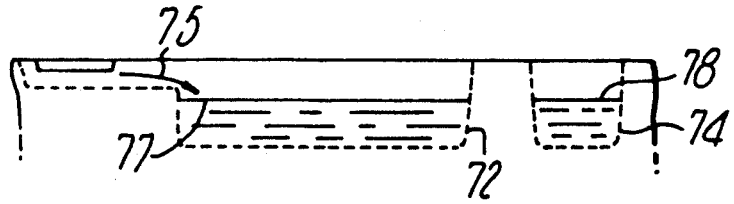
FIGS. 3b to 3e show potential well profiles in the cross-section of FIG. 3a at subsequent stages in the operating sequence.
Figure 3C:
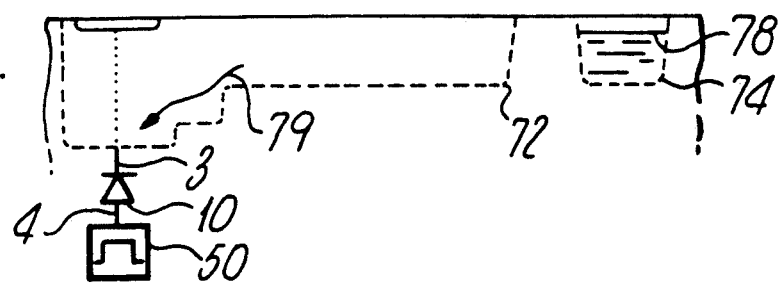

At the end of the charge-signal integration period the voltage applied to the threshold gate 63 by its pulse generator (57) is reduced to increase the underlying potential barrier so as to isolate the charge 78 in the well 74 from the subtracted background charge 77 in the well 72, as illustrated in FIG. 3b. The subtracted background charge 77 is then drained away from the CCD line 30 before the remaining-signal charge 78 is to be transferred along the CCD line 30. In accordance with the present invention this is effected by clocking the voltage level applied to the common electrical connection 4 of the radiation detector diodes 10 by means of the pulse generator 50. The voltage level applied to the input gate 61 is similarly clocked by means of the pulse generator 56. The connection 4 is clocked from its quiescent potential level to a high value of opposite sign from that of the charge 77 to be drained, so forward-biasing the diodes 10; thus, in a typical example of the buried-channel device of FIG. 1 where the charge-carriers 77 are electrons, the connection 4 is switched to a high positive potential, for example +10 volts. The input gate 61 is similarly clocked to a high potential. The result illustrated by arrow 79 in FIG. 3c is that the subtracted charge 77 then flows from the background storage well 72 to the pulse generator 50 via the input connection 2, 3, the associated forward-biased detector diode 10 and the common detector-diode connection 4. The voltage levels of the connection 4 and input gate 61 are then reduced, the connection 4 being clocked to its quiescent value (+5 volts in the example given above).

Figure 3D:
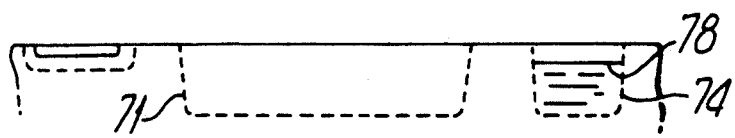
Figure 3E:
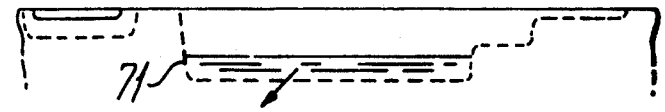

Having drained the background charge 77 from the CCD lines 30, the remaining signal-charge 78 can now be clocked along the CCD lines 30 to the serial output CCD line 40. For this purpose, the voltage applied to the input gate 61 by the generator 56 is such as to isolate the input-connection 2, 3 from CCD line 30, and separate voltage levels are then applied to the clocking electrodes 31 to 34 by the pulse generator 51. FIG. 3d illustrates the situation in which a potential well 71 is formed below one clocking electrode (for example, 34) of each group, these wells 71 being separated along the CCD lines 30 by potential barriers formed below the other clocking electrodes (for example, 31 to 33). The threshold gate 63 is then opened and the potential well 74 below the electrode 64 is reduced by the voltages applied thereto (for example, from the pulse generator 57) so as to transfer the remaining signal-charge 78 into this well 71. By means of the clock voltages $\phi(1)$, $\phi(2)$, $\phi(3)$, $\phi(4)$ applied to the electrodes 31 to 34 this packet of charge 78 is then transferred to a well below the next clocking electrode (for example electrode 31) and so progressively transferred along the CCD line 30 to the serial output line 40 by normal four-phase CCD action.

FIG. 4 illustrates one possible layout of electrodes 31 to 34 at each input-connection location. In this example the clocking electrodes 32, 33 and 34 are all used together to form the background storage electrode 62, and the input connection 2, 3 and input gate 61 are located in a recess at one side of the clocking electrode 33. Also in this example the remaining-signal storage electrode 63 and threshold gate 64 are formed by electrodes which are located at one side of the clocking electrode 34. Although not shown in FIG. 4 for the sake of clarity in the drawing there will generally be a slight overlap between the input connection region 2 and the input gate 61, between the input gate 61 and the clocking electrode 33, between the clocking electrodes 33 and 34, 34 and 31, 31 and 32, and 32 and 33 respectively, between the clocking electrode 34 and the threshold gate 64, and between the threshold gate 64 and the signal storage electrode 63. During the charge integration and background subtraction, charge will be collected in potential wells below the hatched electrodes in FIG. 4, namely the background charge 77 below the electrodes 32, 33 and 34 and the skimmed signal charge 78 below the electrode 64.

FIG. 5 illustrates another possible layout of electrodes at each input-connection location, in which the clocking electrodes of the CCD line 30 serve to provide not only the background storage well 72, but also the threshold gate 63 and the skimmed-signal storage well 74. A particular compact arrangement which does not require the provision of an additional circuit element between the CCD lines 30 to perform the background subtraction and draining functions is obtained. Thus the charge-handling capacity of the CCD lines can be maximised. The lines 30 of FIG. 5 are still four-phase CCD lines, but in this example only the clocking electrode 32 is used as the background storage electrode 62. The clocking electrode 33 is used as the threshold gate 63, and the clocking electrode 34 is used as the skimmed signal storage electrode 64, while the electrode 31 serves to isolate the background storage well under electrode 32 from the preceding skimmed-signal well under electrode 34. All these functions are performed by choosing appropriate clocked voltage levels $\phi(1)$, $\phi(2)$, $\phi(3)$ and $\phi(4)$ applied by the pulse generator 51 during the charge integration and background subtraction stage. Thus there is no separate pulse generator 57.

In the FIG. 5 layout, the background charge 77 is held in a potential well below the hatched electrode 32 while the skimmed signal charge 78 is collected below the hatched electrode 34. At the end of the charge integration and background subtraction stage, the voltage applied to the common detector-diode connection 4 by the generator 50 is increased from its quiescent level to a high positive potential and the voltage applied to the input gate 61 by the pulse generator 56 is similarly increased to drain away the subtracted background charge 77 from the CCD lines 30 via the forward-biased detector diodes 10 in the same manner as described with reference to FIG. 3c. After resetting the input gate 61 as in FIG. 3d, the skimmed signal charge 78 below the clocking electrode 31 is then transferred progressively along the CCD line 30 by normal four-phase CCD action.

In the embodiments so far described, the subtraction gate 63 has been used as a threshold gate for background subtraction in a charge-skimming mode. However it is possible to use such electrode configurations in a charge-partitioning mode to subtract a given fraction of the charge signal at each location. In this latter case, the subtraction gate 63 is held at a potential similar to those of the storage electrodes 62 and 64 during the charge-signal collection and integration stage so as to form a single wide potential well at that stage. Subsequently the potential of the gate 63 is reduced to separate a well 72 below the electrode 62 from a well 74 below the electrode 64 and to divide the charge-signal between these two wells. By means of the voltages applied by the pulse generators 50 and 56, the detector diodes 10 and input gate 61 are then clocked in a manner similar to that of FIG. 3c to drain away the part of the charge-signal held in the well 72.

Figure 6A:
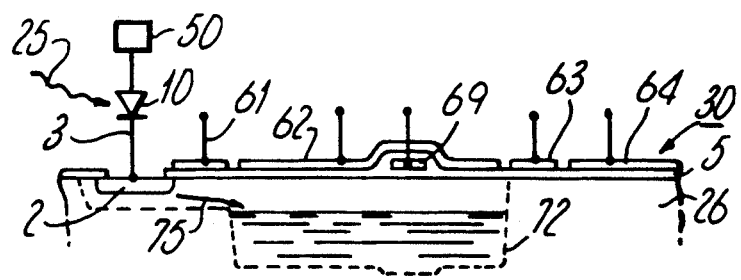
FIG. 6a is a simplified schematic cross-section through one input of a charge-transfer line of a further device arrangement in accordance with the invention, and additionally shows the potential well profile during charge integration.
Figure 6B:
FIGS. 6b to 6e show potential well profiles in the cross-section of FIG. 6a at subsequent stages in the operating sequence.
Figure 6C:
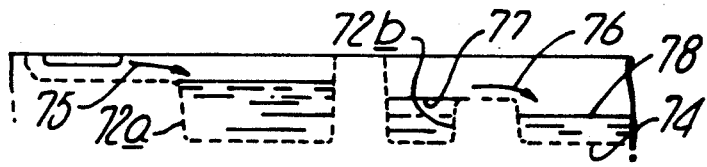
Figure 6D:
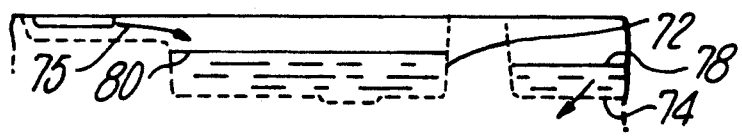
Figure 6E:
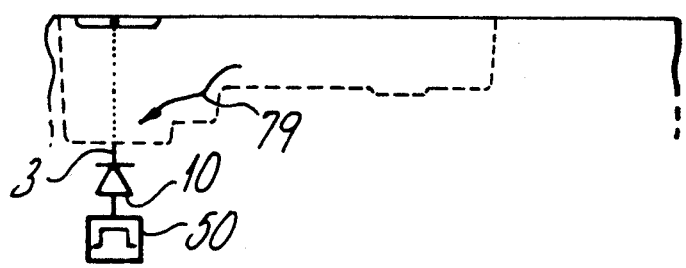

It is also possible to use the present invention in arrangements having both charge-partitioning and charge subtraction. One example is illustrated in FIGS. 6a to 6e. In this example at least the electrode 64 may be formed by one of the clocking electrodes of the CCD line 30. The arrangement is similar to that of FIGS. 3a to 3c except for the provision of a partition gate 69 by which the potential well 72 can be divided into two separate wells 72a and 72b. As indicated by arrow 75 in FIG. 6a, the charge-signal from the detector diode 10 is collected during the integration period in a wide storage well 72 below the storage electrode 62 and the partitition gate 69. The well 72 is isolated from the main CCD line 30 by the potential applied to the threshold gate 63. The partition gate 69 is then clocked to divide the collected charge into two packets the first of which is held in the well 72a while the second is held in the well 72b, as illustrated in FIG. 6b. By lowering the threshold gate 63 to the appropriate threshold level a portion 78 of the second charge-packet is skimmed into a well below the electrode 64 as illustrated by arrow 76 in FIG. 6c. It is this portion 78 which is subsequently transferred along the CCD line 30, as indicated in FIG. 6d. After clocking the gate 63 to isolate the CCD line 30 from the well 72b, the partition gate 69 is again opened to merge the first packet and the subtracted portion of the second packet as indicated in FIG. 6d. In a manner similar to that of FIG. 3c, the common detector-diode connection 4 and the input gate 61 are then clocked to high potentials by means of the pulse generators 50 and 56 respectively so that as indicated by arrow 79 in FIG. 6e this merged charge packet 80 is drained away to the pulse generator 50 via the input connection 2, 3, the associated forward-biased detector diode 10 and the common detector-diode connection 4.

It will be evident that many other modifications are possible within the scope of the present invention. Thus, instead of having a separate input gate 61 and storage electrode 62, the subtracted charge-signal in some arrangements may merely be stored at the highly-doped diffusion region 2 of an input diode and a subtraction gate 63 may be used as an input gate between this diode region 2 and the CCD line 30.

Instead of the cadmium mercury telluride infra-red radiation detector diodes 10 being of the form shown in FIG. 1, they may be formed in an epitaxial layer of cadmium mercury telluride on a cadmium telluride substrate with their individual electrode connections 23 formed by indium or other metal bump connections as in the device arrangement illustrated in FIG. 1 of the previously-mentioned Chow et al paper. The bulk of the cadmium mercury telluride layer can still constitute a common diode region (14) which is connected to the common electrical connection 4. It is also possible for each infra-red radiation detector diode 10 to be formed in a separate body of cadmium mercury telluride mounted on the signal-processing circuit substrate 1. Such arrangements are illustrated in FIG. 10 of the article "CCD Readout of Infra-red Hybrid Focal-Plane Arrays" on pages 175 to 188 of I.E.E.E. Transactions of Electron Devices, Vol. ED-27, No. 1, January 1980 to which reference is made in our co-pending U.K. patent application 8204158 (Our reference: PHB 32767). Especially in the latter case the detector diodes 10 of the array may be grouped into pluralities having different common connections 4. Thus, each row (or alternatively each column) of detector diodes 10 in a 2-dimensional array may have its own common connection 4 which is connected to its own pulse generator 50 in accordance with the present invention. Other infra-red sensitive materials, for example lead tin telluride and indium antimonide may be used for the detector diodes 10. It is also possible to form the detector diodes 10 of silicon for operation in the near infra-red radiation wavebands.

Instead of charge-coupled devices, bucket-brigade devices may be used for the charge-transfer lines.

What I claim is:

1. An infra-red radiation imaging device arrangement comprising a plurality of infra-red radiation detector elements in which charge-signals are generated by incident infra-red radiation, and signal-processing circuitry for processing the charge-signals from the detector elements to provide an output signal representative of the radiation image incident on the detector elements, said circuitry including at least one charge-transfer line to which the radiation detector elements are coupled via input connections, each detector element being electrically connected between the input connection of the charge-transfer line and a second electrical connection of said plurality of detector elements, at least one storage electrode and at least one subtraction gate being present at each of the input connections for subtracting at least one portion of the charge-signal so that only a portion of the charge-signal from each detector element is transferred along the charge-transfer line, and means for draining away the subtracted charge from a storage well below the storage electrode, characterized in that the subtracted charge is drained away via the radiation detector elements by means of a voltage switching means which is connected to the second electrical connection to switch the voltage applied to the radiation detector elements.

2. An imaging device arrangement as claimed in claim 1, further characterized in that the voltage switching means is a voltage pulse generator.

3. An imaging device arrangement as claimed in claim 1, further characterized in that the voltage switching means and the at least one charge-transfer line are provided in a signal-processing circuit substrate to which the radiation detector elements are secured.

4. An imaging device arrangement as claimed in claim 1, further characterized in that the radiation detector elements are photodiodes formed in a common body or body portion of infra-red sensitive material, the bulk of which is a common region connected to the second electrical connection.

5. An imaging device arrangement as claimed in claim 1, further characterized in that the charge-transfer line is one of a plurality of parallel charge-transfer lines, and radiation detector elements which are arranged in a 2-dimensional array are connected to these lines via input connections at locations spaced along the lines.

6. An imaging device arrangement as claimed in claim 5, further characterized in that all the radiation detector elements of the array have a common second connection to which the voltage switching means is connected.

7. An imaging device arrangement as claimed in claim 5, further characterized in that at each of said locations each charge-transfer line has a clocking electrode which has a recess at one side, and an input gate and the input connection are located in each of said recesses.

8. An imaging device arrangement as claimed in claim 4, further characterized in that the radiation detector elements are photodiodes of cadmium mercury telluride.

9. An imaging device arrangement as claimed in claim 1, further characterized in that the at least one subtraction gate present at each of input connections comprises a threshold gate for subtracting a given background level from the charge-signal at that input.

10. An imaging device arrangement as claimed in claim 9, further characterized in that the threshold gate is formed by at least a portion of a clocking electrode of the charge-transfer line.

11. An imaging device arrangement as claimed in claim 1, further characterized in that the at least one subtraction gate present at each of the input connections comprises a partition gate for substracting a given fraction of the charge-signal at that input.

* * * * *